(12) United States Patent
Suh et al.

(10) Patent No.: US 7,705,458 B2
(45) Date of Patent: Apr. 27, 2010

(54) BULK METALLIC GLASS SOLDERS, FOAMED BULK METALLIC GLASS SOLDERS, FOAMED-SOLDER BOND PADS IN CHIP PACKAGES, METHODS OF ASSEMBLING SAME, AND SYSTEMS CONTAINING SAME

(75) Inventors: Daewoong Suh, Phoenix, AZ (US); Yongki Min, Phoenix, AZ (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 11/425,353

(22) Filed: Jun. 20, 2006

(65) Prior Publication Data

US 2007/0290339 A1 Dec. 20, 2007

(51) Int. Cl.
*H01L 23/488* (2006.01)
(52) U.S. Cl. ................ 257/746; 257/E23.028
(58) Field of Classification Search .......... 257/741, 257/746, E23.023, E23.025, E23.028
See application file for complete search history.

(56) References Cited

U.S. PATENT DOCUMENTS

| 4,222,434 | A | 9/1980 | Clyde |
| 4,377,622 | A | 3/1983 | Liebermann |
| 6,286,206 | B1 * | 9/2001 | Li .................... 29/840 |
| 6,442,040 | B2 * | 8/2002 | Raad .................. 361/760 |
| 6,623,566 | B1 * | 9/2003 | Senkov et al. ........... 148/121 |
| 6,809,539 | B2 | 10/2004 | Wada et al. |
| 2005/0084407 | A1 * | 4/2005 | Myrick ................. 419/66 |

OTHER PUBLICATIONS

Swiston Jr. et al. "Joining bulk metallic glass using reactive multilayer foils." Scripta Materials 2003: 48; 1575-1580.*
Schroers, J., et al., "Amorphous Metallic Foam", *Applied Physics Letters*, 82(3), (2003), 370-372.
International Search Report and Written Opinion of the International Searching Authority; Dated Dec. 11, 2007; PCT/US2007/071002 (11 pgs.).
International Preliminary Report on Patentability; Dated Jan. 8, 2009; PCT/US2007/071002 (7 pgs.).

* cited by examiner

*Primary Examiner*—Minh-Loan T Tran
*Assistant Examiner*—W. Wendy Kuo
(74) *Attorney, Agent, or Firm*—John N. Greaves (57) ABSTRACT

A foamed bulk metallic glass electrical connection is formed on a substrate of an integrated circuit package. The foamed bulk metallic glass electrical connection exhibits a low modulus that resists cracking during shock and dynamic loading. The foamed bulk metallic glass electrical connection is used as a solder bump for communication between an integrated circuit device and external structures. A process of forming the foamed bulk metallic glass electrical connection includes mixing bulk metallic glass with a blowing agent.

23 Claims, 10 Drawing Sheets

BULK METALLIC GLASS SOLDERS, FOAMED BULK METALLIC GLASS SOLDERS, FOAMED-SOLDER BOND PADS IN CHIP PACKAGES, METHODS OF ASSEMBLING SAME, AND SYSTEMS CONTAINING SAME

TECHNICAL FIELD

Embodiments relate generally to integrated circuit fabrication. More particularly, embodiments relate to electrical connections in integrated circuit fabrication.

BACKGROUND

Electrical connections are an important part of a packaged integrated circuit (IC). An IC die is often fabricated into a microelectronic device such as a processor. The electrical connections experience thermal stresses during the operation of the IC die. Also during fabrication and handling, a packaged IC die may experience physical shock that can compromise the integrity of the electrical connections.

BRIEF DESCRIPTION OF THE DRAWINGS

In order to depict the manner in which the embodiments are obtained, a more particular description of embodiments briefly described above will be rendered by reference to specific embodiments that are illustrated in the appended drawings. Understanding that these drawings depict only typical embodiments that are not necessarily drawn to scale and are not, therefore, to be considered to be limiting of its scope, the embodiments will be described and explained with additional specificity and detail through the use of the accompanying drawings in which.

DETAILED DESCRIPTION

Embodiments in this disclosure relate to a bulk metallic glass (BMG) that is used in an integrated circuit (IC). Embodiments also relate to foamed solder metallurgies of bulk metallic glasses that are useful to form closed-cell and reticulated bulk metallic glass solders.

The following description includes terms, such as upper, lower, first, second, etc., that are used for descriptive purposes only and are not to be construed as limiting. The embodiments of a device or article described herein can be manufactured, used, or shipped in a number of positions and orientations. The terms "die" and "chip" generally refer to the physical object that is the basic workpiece that is transformed by various process operations into the desired integrated circuit device. A die is usually singulated from a wafer, and wafers may be made of semiconducting, non-semiconducting, or combinations of semiconducting and non-semiconducting materials. A board is typically a resin-impregnated fiberglass structure that acts as a mounting substrate for the die.

The disclosure relates to at least one of a foamed electrical connection or a BMG electrical connection. Bulk metallic glasses are basically of a metal composition, but do not form metallic lattices like conventional metals. In an embodiment, the electrical connection is a bond pad. In an embodiment, the electrical connection is an electrical bump. In an embodiment, the electrical connection is a metallization interconnect. In an embodiment, the electrical connection is a trace. Throughout this disclosure, electrical connections in the macrostructural configuration can include at least one of a foamed electrical connection or a BMG electrical connection.

In an embodiment, the electrical connection is a BMG material. In an embodiment, the BMG is a zirconium-containing BMG type. In an embodiment, the BMG is a zirconium-aluminum containing BMG type. Selected, but non-exhaustive zirconium-aluminum containing BMGs include ZrAlCuO, ZrAlNiCuO, ZrTiAlNiCuO, ZrAlNiCu(Cr, Mo), ZrAlNiCu(Ag, Pd, Au, Pt), ZrAlNiCu(Nb, Ta, V), ZrAlNi (Ag, Pd, Au, Pt), ZrAlCuPd, and ZrAlCu(Pd, Au, Pt). Table 1 illustrates examples of zirconium-aluminum BMG embodiments.

TABLE 1

| | ZrAl BMG |
|---|---|
| Example | Composition |
| 1 | $Zr_{65}Al_{7.5}Cu_{27.5} + O$ |
| 2 | $Zr_{65}Al_{7.5}Ni_{10}Cu_{17.5} + O$ |
| 3 | $Zr_{65}Ti_3Al_{10}Ni_8Cu_{20} + O$ |
| 4 | $Zr_{65}Al_{7.5}Ni_{10}Cu_{12.5}(Cr, Mo)_5$ |
| 5 | $Zr_{65}Al_{7.5}Ni_{10}Cu_{7.5}(Ag, Pd, Au, Pt)_{10}$ |
| 6 | $Zr_{65}Al_{7.5}Ni_{10}Cu_{12.5}(Nb, Ta, V)_5$ |
| 7 | $Zr_{65}Al_{7.5}Ni_{10}(Ag, Pd, Au, Pt)_{17.5}$ |
| 8 | $Zr_{65}Al_{7.5}Cu_{17.5}Pd_{10}$ |
| 9 | $Zr_{65}Al_{10}Cu_{10}(Pd, Au, Pt)_{10}$ |

In an embodiment, the BMG is a zirconium-nickel containing BMG type. Selected, but non-exhaustive zirconium-nickel containing BMGs include ZrNi(Fe, Co) and ZrNi(Pd, Au, Pt). Table 2 illustrates examples of zirconium-nickel BMG embodiments.

TABLE 2

ZrNi BMG

| Example | Composition |
|---|---|
| 10 | $Zr_{70}Ni_{10}(Fe, Co)_{20}$ |
| 11 | $Zr_{70}Ni_{20}(Pd, Au, Pt)_{10}$ |

In an embodiment, the BMG is a zirconium-platinum group containing BMG type. Selected, but non-exhaustive zirconium-platinum group containing BMGs include ZrCuPd, ZrPd, and ZrPt. Table 3 illustrates examples of zirconium-platinum group BMG embodiments.

TABLE 3

ZrPt BMG

| Example | Composition |
|---|---|
| 12 | $Zr_{70}Cu_{10}Pd_{20}$ |
| 13 | $Zr_{70}Pd_{30}$ |
| 14 | $Zr_{80}Pt_{20}$ |

In an embodiment, the BMG is a hafnium-containing BMG type. Selected, but non-exhaustive hafnium-containing BMGs include HfAlNiCu, HfAlNiCuPd, HfAlNiAg, and HfCu(Pd, Pt). Table 4 illustrates examples of zirconium-hafnium BMG embodiments.

TABLE 4

ZrHf BMG

| Example | Composition |
|---|---|
| 15 | $Hf_{65}Al_{7.5}Ni_{10}Cu_{12.5}$ |
| 16 | $Hf_{65}Al_{7.5}Ni_{10}Cu_{12.5}Pd_5$ |
| 17 | $Hf_{65}Al_{7.5}Ni_{10}Ag_{17.5}$ |
| 18 | $Hf_{70}Cu_{20}(Pd, Pt)_{10}$ |

In an embodiment, the BMG is a titanium-containing BMG type. Selected, but non-exhaustive titanium-containing BMGs include TiZrNi, and TiZrNiCu. Table 5 illustrates examples of zirconium-containing BMG embodiments.

TABLE 5

Ti BMG

| Example | Composition |
|---|---|
| 19 | $Ti_{45}Zr_{38}Ni_{17}$ |
| 20 | $Ti_{60}Zr_{15}Ni_{15}Cu_{10}$ |

In an embodiment, the BMG is an iron-containing BMG type. A selected, but non-exhaustive iron-containing BMG includes Fe(Nb, W, Ta)B. An illustrated example (Example 21) of an iron-containing BMG embodiment is $Fe_{60}(Nb, W, Ta)_{10}B_{30}$.

In an embodiment, a combination of at least two of the above BMG types is used as an electrical connection. In an embodiment, a combination of at least three of the above BMG types is used as an electrical connection. In an embodiment, a combination of at least four of the above BMG types is used as an electrical connection. In an embodiment, a combination of at least five of the above BMG types is used as an electrical connection.

In an embodiment, an electrical connection is a foamed BMG of a first material, and the relative density of the foamed BMG is in a range from about 0.1 to about 0.9. By "relative density," it is meant that the density of the foamed BMG is compared to a solid BMG of the same material. A solid BMG of the same material can be ascertained by review of the classical-physics densities of materials like alloys and pure metals such as can be found in reference materials or by the Archimedes method.

In an embodiment, the foamed metal of a first material has a relative density of about 0.5. In an embodiment, the foamed metal of a first material has a relative density of about 0.6. In an embodiment, the foamed metal of a first material has a relative density of about 0.7. In an embodiment, the foamed metal of a first material has a relative density of about 0.8.

One way to resist shock in an IC package is to improve the Young's modulus (m) of the BMG in the electrical connection. Under shock loading conditions that are carried out in IC package testing, strain rates can be on the order of about $10^2$/sec for both dynamic and impact loadings. In an embodiment under this strain rate, foamed BMG electrical connection embodiments exhibit so-called strain-rate sensitivity. In other words, foamed BMG electrical connection embodiments become stronger with increasing strain rate. The strain rate sensitivity becomes significant when the embodied foamed BMG electrical connection materials are subject to a high homologous temperature during operation. For example, with an m of about 0.2, the strain rate of $10^2$/sec increases yield strength to about 250% of quasi-static yield strength. Because of this discovery, plastic deformation is suppressed and stress-strain behavior of foamed BMG electrical connection embodiments diverges positively from classical stress-strain behavior of metals in quasi-static yield strength under shock-loading conditions. By use of a foamed BMG electrical connection, the modulus is further improved to make a package even more resistant to thermal and physical shock.

Reference will now be made to the drawings wherein like structures will be provided with like suffix reference designations. In order to show the structures of various embodiments most clearly, the drawings included herein are diagrammatic representations of integrated circuit structures. Thus, the actual appearance of the fabricated structures, for example in a photomicrograph, may appear different while still incorporating the essential structures of the illustrated embodiments. Moreover, the drawings show only the structures necessary to understand the illustrated embodiments. Additional structures known in the art have not been included to maintain the clarity of the drawings.

Figure 1:
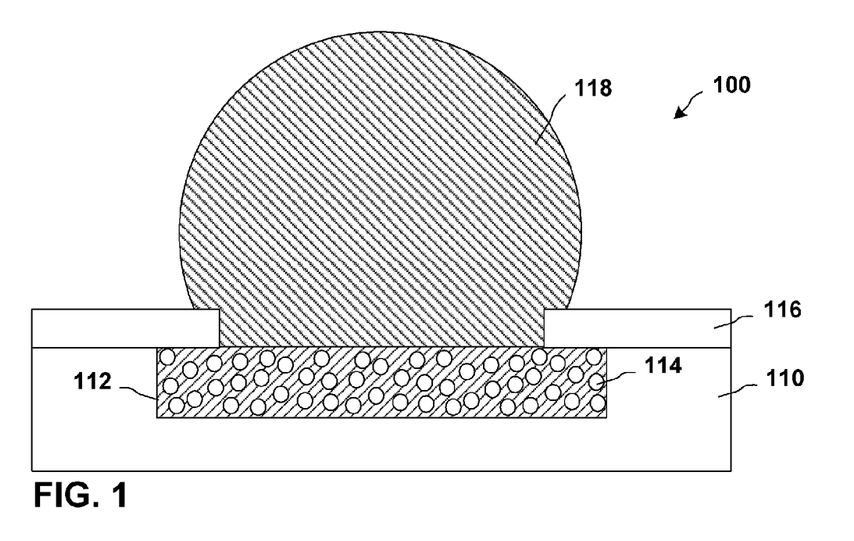
FIG. 1 is an elevational cross-section of an article that includes a foamed bond pad according to an embodiment.

FIG. 1 is an elevational cross-section of an article that includes a foamed bond pad according to an embodiment. The article 100 includes a substrate 110. In an embodiment, the substrate 110 is an IC die. In an embodiment, the substrate 110 is a mounting substrate such as a board or a interposer. The article 100 also includes a bond pad 112 as a macrostructural electrical connection that is disposed on or in the substrate 110 and that is exposed through a solder mask 116. As illustrated, the bond pad 112 is embedded within the substrate 110, but the bond pad 112 can also be disposed upon the surface of the substrate 110, depending upon a given selected application. The bond pad 112 is depicted as being foamed such that a foam cell 114 microstructural electrical connection is depicted as enclosed within the bond pad 112. In an embodiment, the foam cell 114 is a closed-cell foam. In an embodiment, the foam cell 114 is an open-cell foam, which is also referred to as a reticulated foam.

In an embodiment, the bond pad 112 is not foamed, but includes at least one BMG type as set forth in this disclosure. In an embodiment, the bond pad 112 is foamed and it includes at least one BMG type as set forth in this disclosure.

The article 100 also includes an electrical bump 118 macrostructural electrical connection according to an embodiment. In an embodiment, the electrical bump 118 is a foamed microstructural electrical connection. In an embodiment, the electrical bump 118 is a BMG. In an embodiment, the electrical bump 118 is both foamed and a BMG. Hereinafter, structures such as bond pads and bumps are understood to be macrostructural electrical connection configurations, and the foamed embodiments are understood to be microstructural electrical connection configurations. In an embodiment, the electrical bump 118 is a first electrical bump and it is spaced apart from a second electrical bump by a pitch of less than or about 0.8 millimeter. In an embodiment, the macrostructural configuration of the electrical bump 118 is a die-side electrical bump and the substrate 110 is a flip chip. In an embodiment, the macrostructural configuration of the electrical bump 118 is a board-side electrical bump and the substrate 110 is a mounting substrate such as an interposer.

Figure 2:
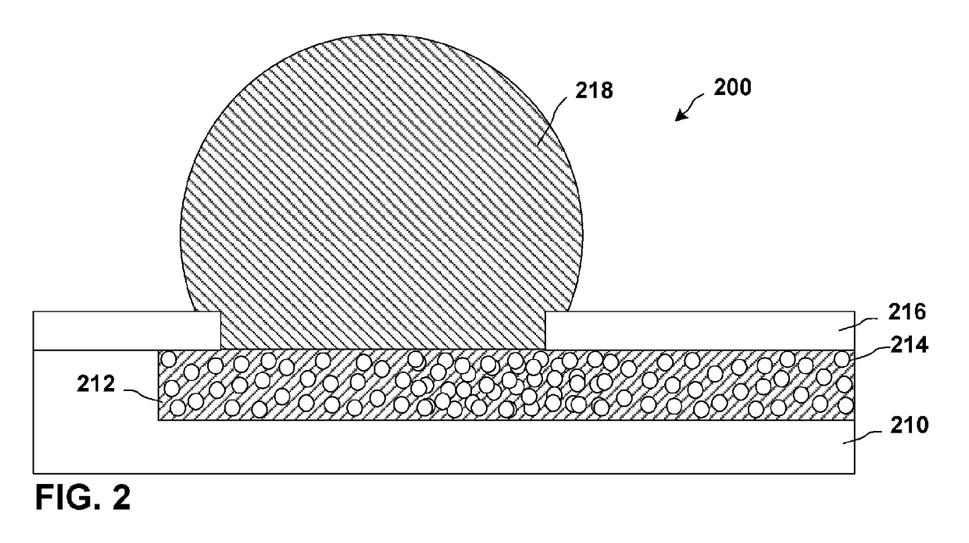
FIG. 2 is an elevational cross-section of an article that includes a foamed bond finger and trace according to an embodiment.

FIG. 2 is an elevational cross-section of an article 200 that includes a foamed bond finger and trace according to an embodiment. The article 200 includes a substrate 210. In an embodiment, the substrate 210 is an IC die. In an embodiment, the substrate 210 is a mounting substrate such as a board or an interposer. The article 200 also includes a trace and exposed bond finger 212 that is disposed on or in the substrate 210 and that is exposed through a solder mask 216. As illustrated, the trace and exposed bond finger 212 is embedded within the substrate 210, but the exposed portion of the bond finger 212 can also be disposed upon the surface of the substrate 210, depending upon a given selected application. The trace and exposed bond finger 212 is depicted as being foamed such that a foam cell 214 is depicted as enclosed within the trace and exposed bond finger 212. In an embodiment, the foam cell 214 is a closed-cell foam. In an embodiment, the foam cell 214 is an open-cell foam, which is also referred to as a reticulated foam.

In an embodiment, the trace and exposed bond finger 212 is not foamed, but includes at least one BMG type as set forth in this disclosure. In an embodiment, the trace and exposed bond finger 212 is foamed and it includes at least one BMG type as set forth in this disclosure.

The article 200 also includes an electrical bump 218 according to an embodiment. In an embodiment, the electrical bump 218 is foamed. In an embodiment, the electrical bump 218 is a BMG. In an embodiment, the electrical bump 218 is both foamed and a BMG.

Figure 3:
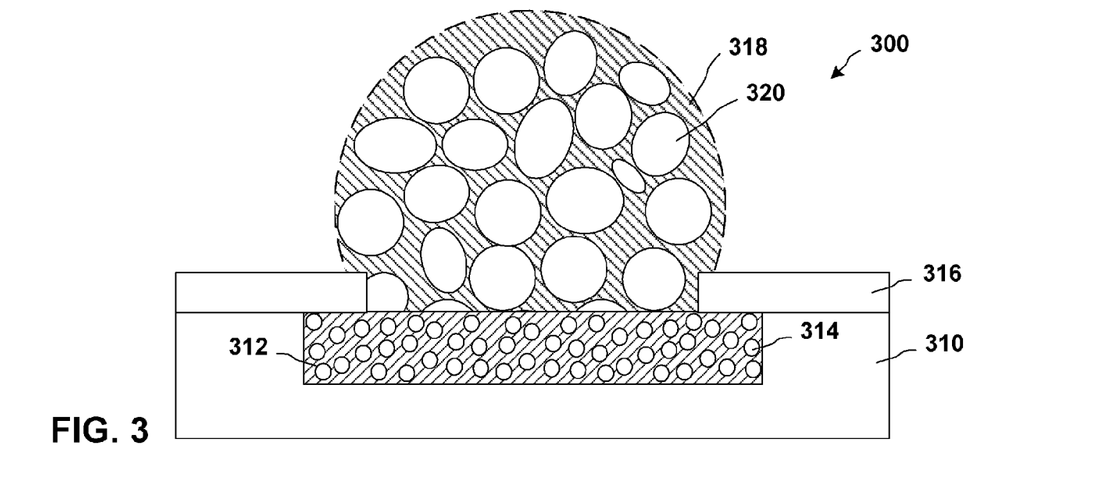
FIG. 3 is an elevational cross-section of an article that includes a foamed bond pad and electrical bump according to an embodiment.

FIG. 3 is an elevational cross-section of an article 300 that includes a foamed bond pad and electrical bump according to an embodiment. The article 300 includes a substrate 310. In an embodiment, the substrate 310 is an IC die. In an embodiment, the substrate 310 is a mounting substrate such as a board or a interposer. The article 300 also includes a bond pad 312 that is disposed on or in the substrate 310 and that is exposed through a solder mask 316. As illustrated, the bond pad 312 is embedded within the substrate 310, but the bond pad 312 can also be disposed upon the surface of the substrate 310, depending upon a given selected application. The bond pad 312 is depicted as being foamed such that a pad foam cell 314 is depicted as enclosed within the bond pad 312. In an embodiment, the pad foam cell 314 is a closed-cell foam. In an embodiment, the pad foam cell 314 is an open-cell foam, which is also referred to as a reticulated foam.

In an embodiment, the bond pad 312 is not foamed, but includes at least one BMG type as set forth in this disclosure. In an embodiment, the bond pad 312 is foamed and it includes at least one BMG type as set forth in this disclosure.

The article 300 also includes a foamed electrical bump 318 according to an embodiment. The foamed electrical bump 318 is illustrated with a bump foam cell 320 that has a larger foam cell size than that illustrated as the pad foam cell 314. In an embodiment, the foam sizes are relatively the same. In an embodiment, the bump foam cell 320 is smaller in size than the pad foam cell 314.

Figure 4:
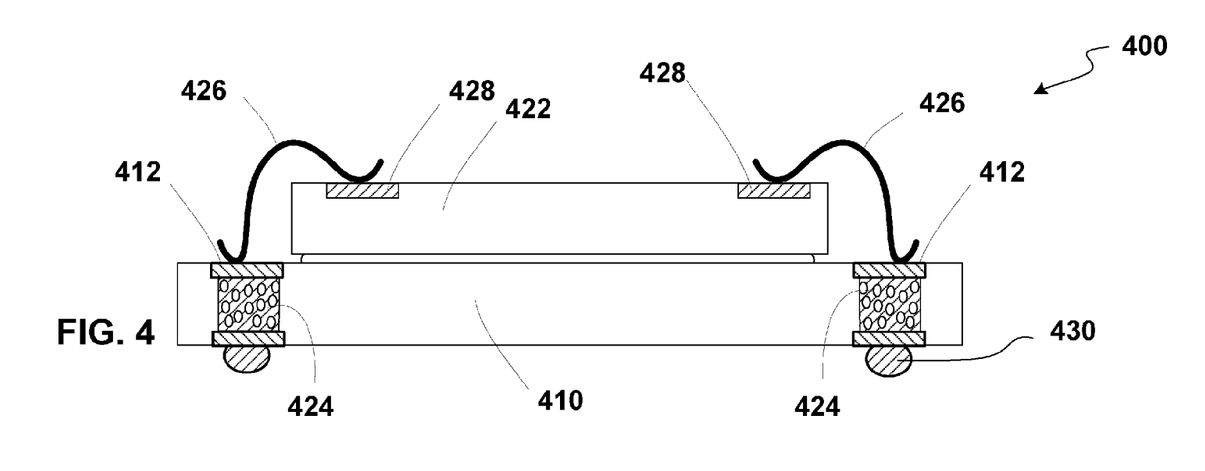
FIG. 4 is an elevational cross-section of an article that includes a foamed metallization interconnect according to an embodiment.

FIG. 4 is an elevational cross-section of an article 400 that includes a foamed metallization interconnect according to an embodiment. The article 400 is depicted as a wire-bond die 422 that is disposed on a mounting substrate 410. The article 400 also includes a mounting substrate bond pad 412 that is disposed on or in the mounting substrate 410.

A metallization interconnect 424 as illustrated is depicted as a foamed metal according to an embodiment. In an embodiment, the metallization interconnect 424 is not foamed, but includes at least one BMG type as set forth in this disclosure. In an embodiment, the metallization interconnect 424 is a foamed BMG of at least one BMG type as set forth in this disclosure.

A bond wire 426 couples the wire-bond die 422 to the mounting substrate 410. The bond wire 426 forms an electrical coupling between a die bond pad 428 and the mounting substrate bond pad 412. In an embodiment, the mounting substrate 410 is further coupleable by a mounting substrate electrical bump 430, such as for mounting upon a board. In an embodiment, the mounting substrate electrical bump 430 is foamed. In an embodiment, the mounting substrate electrical bump 430 is a BMG type as set forth in this disclosure. In an embodiment, the mounting substrate electrical bump 430 is a foamed BMG type as set forth in this disclosure.

In an embodiment, the article 400 is used in a hand-held device such as a wireless communicator. The article 400 can withstand substantial physical shock because of at least one of the BMG embodiment or the foamed interconnect embodiment.

Figure 5:
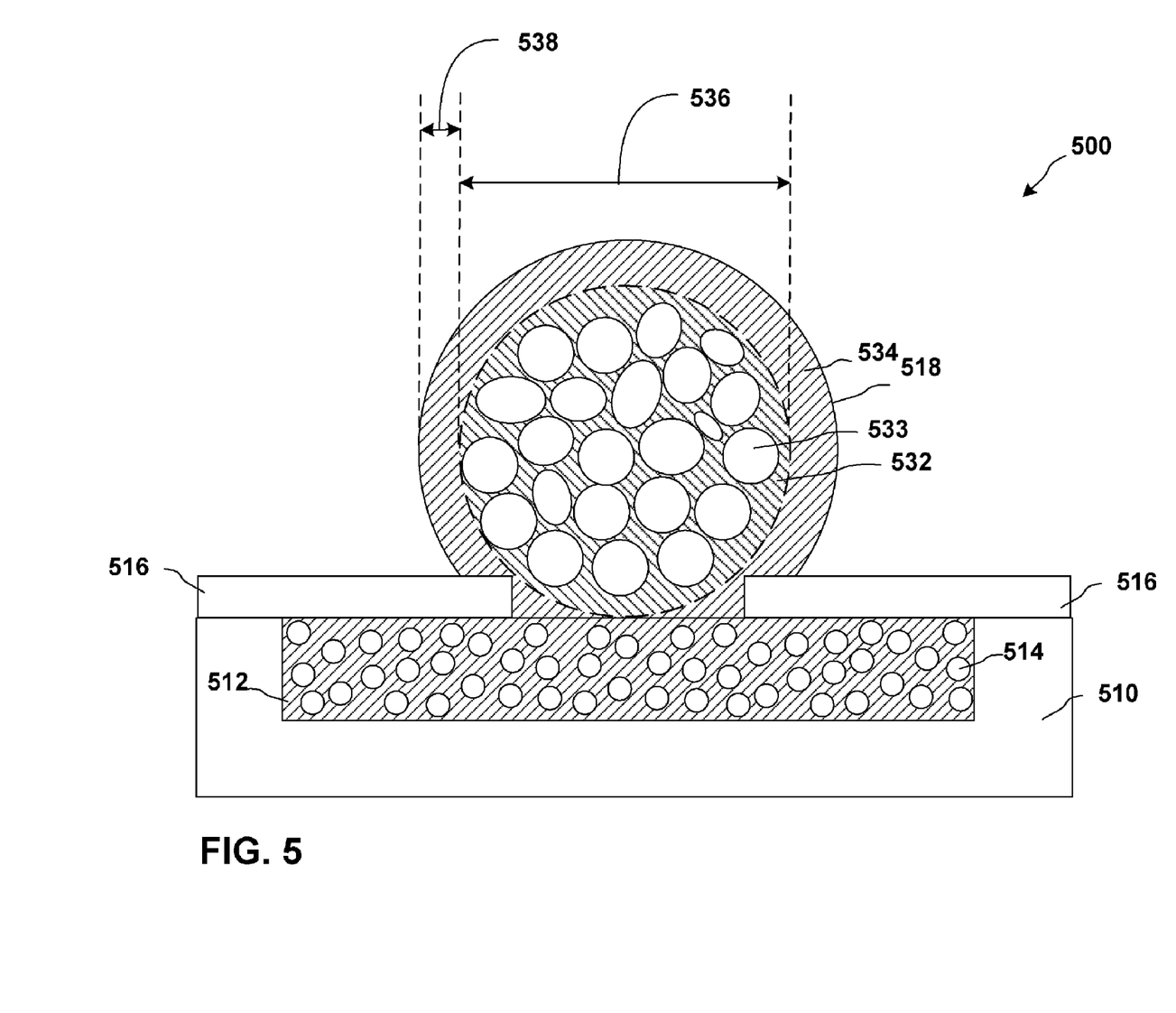
FIG. 5 is an elevational cross-section of an article that includes a foamed bond pad and electrical bump, that also includes the electrical bump as a foamed solder core in a solder shell according to an embodiment.

FIG. 5 is an elevational cross-section of an article 500 that includes a foamed bond pad and electrical bump, that also includes the electrical bump as a foamed solder core in a solder shell according to an embodiment. The article 500 includes a substrate 510. In an embodiment, the substrate 510 is an IC die. In an embodiment, the substrate 510 is a mounting substrate such as a board or an interposer. The article 500 also includes a bond pad 512 that is disposed on or in the substrate 510 and that is exposed through a solder mask 516. As illustrated, the bond pad 512 is embedded within the substrate 510, but the bond pad 512 can also be disposed upon the surface of the substrate 510, depending upon a given selected application. The bond pad 512 is depicted as being foamed such that a foam cell 514 is depicted as enclosed within the bond pad 512. In an embodiment, the foam cell 514 is a closed-cell foam. In an embodiment, the foam cell 514 is an open-cell foam, which is also referred to as a reticulated foam.

In an embodiment, a solder bump 518 is depicted with a foamed solder core 532 and a solder shell 534. In an embodiment, the solder bump 518 exhibits a modulus in a range between about 0.2 and about 0.7.

In an embodiment, the solder shell 534 is an intermetallic derivative of the foamed solder core 532. The foamed solder core 532 includes a bump foam cell 533. The intermetallic derivative can be any composition that intermingles with the foamed solder core 532 under processing conditions such as reflow, to form an intermetallic material. In an embodiment, the foamed solder core 532 is a BMG. In an embodiment, the solder shell 534 is a BMG. In an embodiment, both the foamed solder core 532 and the solder shell 534 are BMGs.

In an embodiment, the foamed solder core 532 has a diameter 536 of unity, and the thickness 538 of the solder shell 534 is in a range from about 1 percent of unity to about 100 percent of unity. In an embodiment, the solder shell 534 has a thickness that is in a range from about 5 percent of unity to about 20 percent of unity. In an embodiment, the solder shell 534 has a thickness that is in a range from about 6 percent of unity to about 19 percent of unity.

In an embodiment, the size of the solder bump 518, and therefore the approximate dimensions of the foamed solder core 532 and the solder shell 534 can be ascertained by the size of the bond pad 512. In an embodiment, the bond pad 512 is about 106 micrometers (μm). In an embodiment, the diameter 536 of the foamed solder core 532 and twice the thickness 538 of the solder shell 534 also is about 106 μm. Other dimensions can be selected depending upon the application.

Figure 6:
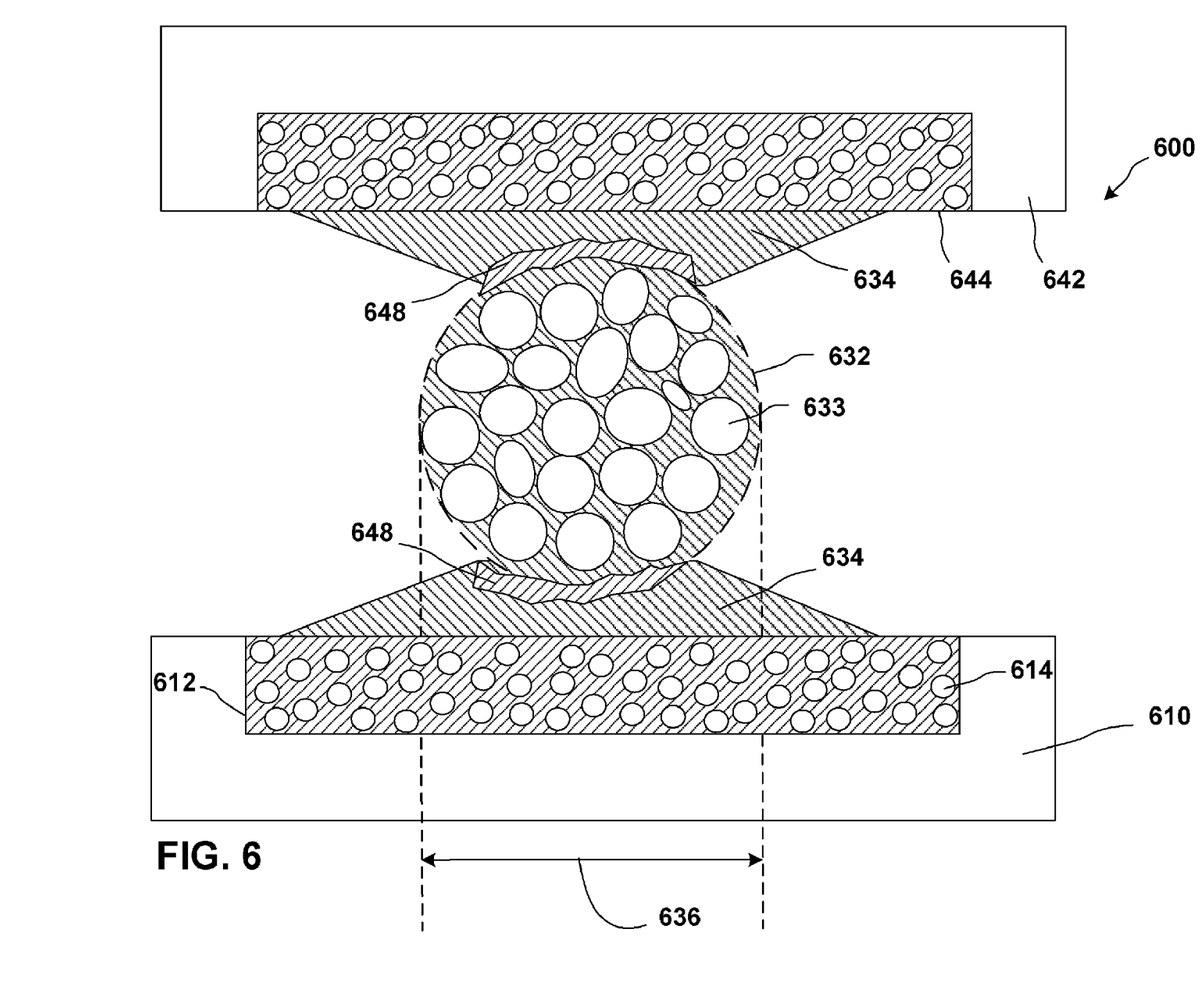
FIG. 6 is an elevational cross-section of an article that includes a foamed solder core first material that is disposed upon a solder substrate second material according to an embodiment.

FIG. 6 is an elevational cross-section of an article 600 that includes a foamed solder core first material that is disposed upon a solder substrate second material according to an embodiment. The article 600 includes a mounting substrate 610. In an embodiment, the mounting substrate 610 is an IC die. In an embodiment, the mounting substrate 610 is a mounting substrate such as a board or an interposer. The article 600 also includes a bond pad 612 that is disposed on or in the substrate 610. As illustrated, the bond pad 612 is embedded within the substrate 610, but the bond pad 612 can also be disposed upon the surface of the substrate 610, depending upon a given selected application. The bond pad 612 is depicted as being foamed such that a foam cell 614 is depicted as enclosed within the bond pad 612. In an embodiment, the foam cell 614 is a closed-cell foam. In an embodiment, the foam cell 614 is an open-cell foam, which is also referred to as a reticulated foam.

A foamed solder core 632 first material is mounted on a solder substrate 634 second material. In an embodiment, the foamed solder core 632 first material is a BMG. The foamed solder core 632 includes a bump foam cell 633. In an embodiment, the solder substrate 634 second material is a BMG. In an embodiment, the solder substrate 634 second material is a reflowed solder that is denser than the foamed solder core 632 first material. In an embodiment, reflowing of the solder substrate 634 second material is carried out at a temperature that is below the liquidus temperature of the foamed solder core 632 first material.

The foamed solder core 632 first material is depicted schematically, and it can be either of a cellular-foamed solder or a reticulated-foamed solder according to an embodiment. In an embodiment, the foamed solder core 632 first material is a BMG. In an embodiment, the bond pad 612 exhibits elongated columnar grain morphology that is characteristic of a plating process.

In an embodiment, an upper substrate 642 and an upper bond pad 644 is located above the foamed solder core 632 first material according to an embodiment. In an embodiment, the upper substrate 642 is an IC die. In an embodiment, the upper substrate 642 is a mounting substrate such as a printed wiring board. In an embodiment, the foamed solder core 632 first material exhibits a modulus in a range between about 0.2 and about 0.7.

In an embodiment, the foamed solder core 632 first material has a diameter 636 in a range from about 25 μm to about 200 μm. In an embodiment, the foamed solder core 632 first material has a diameter 636 of about 106 μm. In an embodiment, the size of the foamed solder core 632 first material can be ascertained by the size of the bond pad 612. In an embodiment, the bond pad 612 is about 106 μm. Other dimensions can be selected depending upon the application.

In an embodiment, the solder substrate 634 second material before reflow includes a particle having a size in a range from about 2 nm to 50 nm. In an embodiment, the solder substrate 634 second material includes a particle having a size in a range from about 10 nm to about 30 nm. In an embodiment, the solder substrate 634 second material includes a particle having a size in a range of about 98% less than or equal to about 20 nm.

In an embodiment, the solder substrate 634 second material includes a melting temperature equal to or below about 400° C. Depending upon the metal type and the particle size, the solder substrate 634 second material can have a change in melting temperature of several hundred degrees.

Where the solder substrate 634 second material and the foamed solder core 632 first material are of different metals or different alloys, an intermetallic region 648 can form therebetween.

Figure 7:
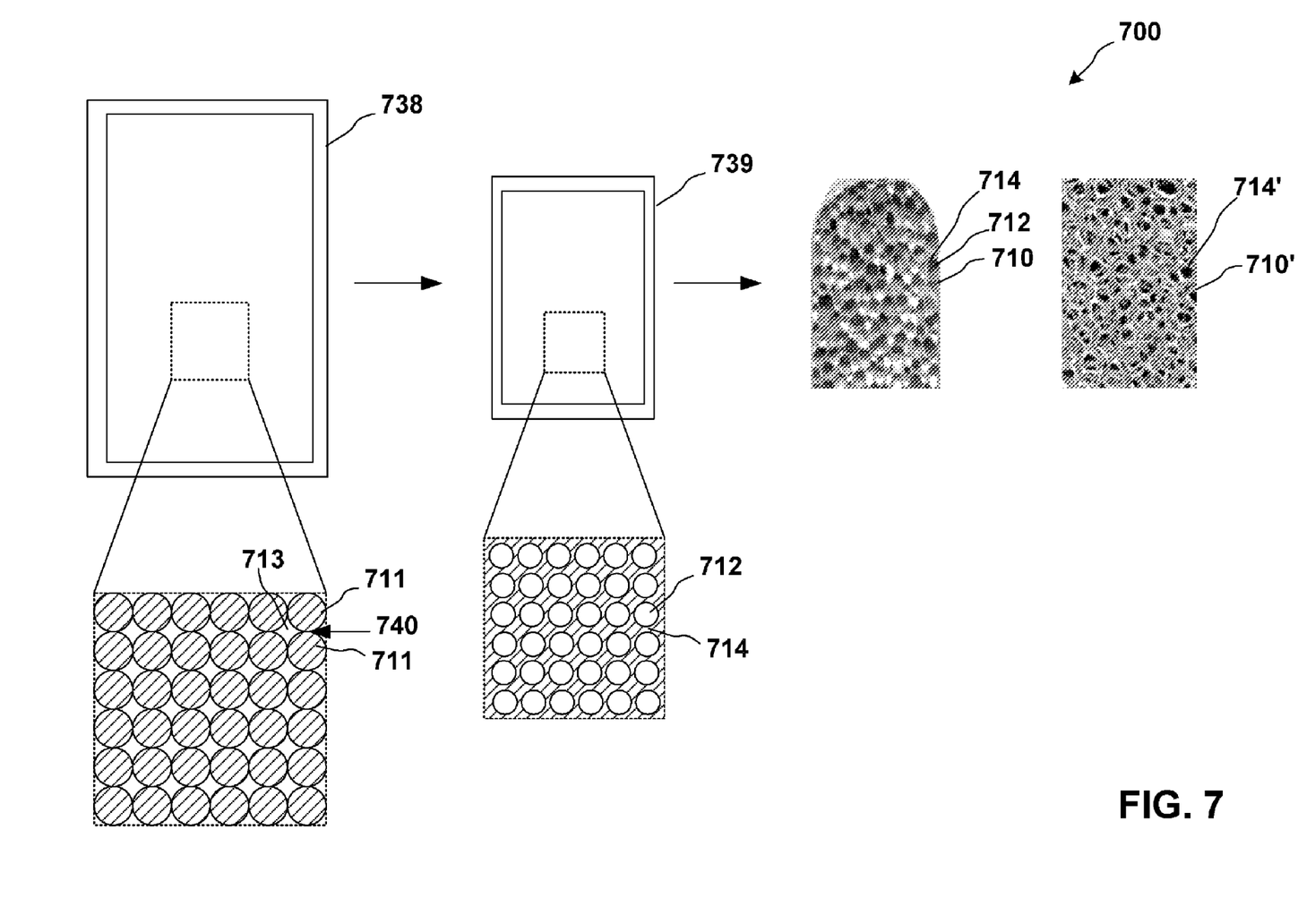
FIG. 7 is a process depiction of forming a foamed BMG according to an embodiment.

FIG. 7 is a process depiction 700 of forming a foamed BMG according to an embodiment. Processing begins by first intermingling a foamed BMG precursor 711 with a compressible gas 713. In an embodiment, the foamed BMG precursor 711 is a metal particulate. In an embodiment, the compressible gas 713 is inert to the metal of the foamed BMG precursor. In an embodiment, the compressible gas 713 is argon.

In FIG. 7, the foamed BMG precursor 711 is placed into a can 738 as is known in the metal-consolidation art. The filled can 738 is then processed by compressing to achieve a high-pressure can 739 that contains the foamed BMG precursor 711 and the compressible gas 713. In an embodiment, the high-pressure can 739 is achieved by hot-isostatic pressing (HIPing), as is known in the metal-consolidation art. After HIPing, the high-pressure can 739 is further heated without significantly restrictive external pressure, and the high-pressure can 739 expands such that a BMG foam 710 is formed that includes a metal chamber 712 and a metal wall 714 if the foamed BMG is a cellular-foamed BMG. Alternatively after HIPing, the high-pressure can 739 is further heated without significantly restrictive external pressure, and the high-pressure can 739 expands such that a metal foam 710' is formed that includes metal ganglia 714' that formed if the foamed BMG is a reticulated-foamed BMG.

In an embodiment, the filled can 738 is not HIPed, but rather it is first heated to cause sintering of the foamed BMG precursor 711, as is understood in the metal-consolidation art. Sintering does not cause a complete reflow of the foamed BMG precursor 711, rather, a nucleation of contact points 740 between two occurrences of the foamed BMG precursor 711. Second heating of the foamed BMG precursor 711 forms a BMG foam 710 such that first sintering and second heating expansion of the foamed BMG occurs. In an embodiment, the first sintering achieves a foamed BMG such that a metal foam 710 is a cellular-foamed BMG. Alternatively, the first heating achieves a foamed BMG such that a metal foam 710' with metal ganglia 714' formed.

In an embodiment, the filled can 738 is first consolidated without significant external heating, and second heated to cause the BMG precursor 711 to expand. In an embodiment, the second heating achieves a foamed BMG such that a metal foam 710 is a cellular-foamed BMG. Alternatively, the second heating achieves a foamed BMG such that a metal foam 710' with metal ganglia 714' formed.

Other techniques are usable to form the foamed BMG. In an embodiment, investment casting is used as is known in the art. In an embodiment, melt processing is used, along with the decomposition of metal hydride, which forms a gas that creates the porosity in the foamed BMG. In an embodiment, powder processing is used that exploits the decomposition of the metal hydride. In an embodiment, a polymer prefoam is used as a voiding agent temporary support structure to support the foamed BMG as it solidifies, after which the polymer prefoam is driven off. In an embodiment, the voiding agent is permanent, and it resists absorptive wetting of the BMG, if any, during processing.

In an embodiment, metal powder is packed into a can, which is outgassed and then pressurized with argon gas. The can is HIPed to consolidate the metal powder. After consolidation, the can is heated to expand the entrapped gas by creep of the surrounding matrix in the HIPed powder. This technique is available to produce porous metals with bulk densities in a range from about 0.6 to about 0.8. The size and distribution of pores may be precisely controlled using appropriate gas pressure, metal surfactant content, heating time, temperature, and other parameters.

In an embodiment, after forming of the metal foam 710 or the metal foam 710', the metal foam (hereinafter "metal foam 710") is further processed to prepare a solder bump. In an embodiment, the metal foam 710 is first extruded without destroying the foamed quality, and it is cut as wire into short sections by a heading machine until the wire is substantially cubical or solid cylindrical. Processing of the substantially cubical or solid cylindrical pieces of foamed BMG includes tumbling to achieve a more spherical shape, or grinding in a mill. In an embodiment, autogenous grinding of the substantially cubical or solid cylindrical foamed BMG is done in a tumbling mill. In an embodiment, semi-autogenous grinding of the substantially cubical or solid cylindrical foamed BMG is done in a tumbling mill with the presence of a first amount of grinding media such as ceramic balls. In an embodiment, mill-grinding of the substantially cubical or solid cylindrical foamed BMG is done in a tumbling mill with a second amount of grinding media that is greater than the first amount of grinding media. In an embodiment after first grinding the foamed BMG to achieve a spherical shape, surface finishing is carried out in a less extreme tumbling environment.

Once the foamed BMG core or the foamed BMG sphere is made, solder can be coated on the foamed BMG by electroplating according to an embodiment.

Figure 8:
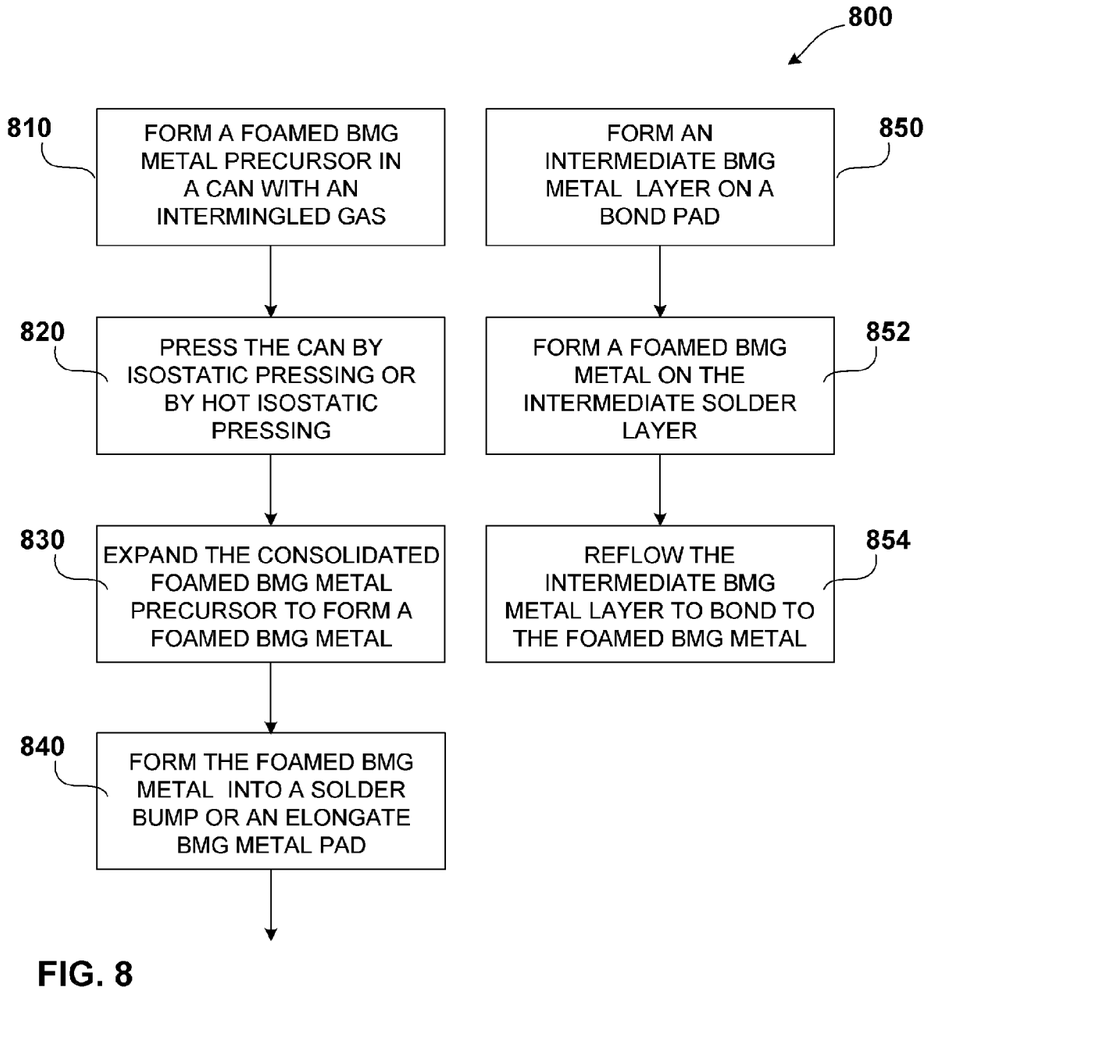
FIG. 8 is a flow chart that describes a process flow according to various embodiments.

FIG. 8 is a flow chart that describes a process flow 800 according to various embodiments.

At 810, the process includes forming a foamed BMG precursor in a can along with an intermingled gas.

At 820, the process includes pressing the can. The process can include isostatic pressing or HIPing.

At 830, the process includes expanding the can under conditions to cause the foamed BMG precursor to form a cellular foam or a reticulated foam. In an embodiment, the process terminates at 830.

At 840, the process includes forming the foamed BMG metal into a solder bump or into a foamed-elongate metal pad.

At 850, a process embodiment includes forming an intermediate solder layer on a bond pad. In an embodiment, the intermediate solder layer is a BMG perform.

At 852, the process includes forming a foamed-solder such as a foamed BMG bump or a foamed BMG elongate pad on the intermediate solder layer.

At 854, the process includes reflowing the BMG metal layer to bond to the foamed BMG. In an embodiment, the process terminates at 854.

Figure 9:
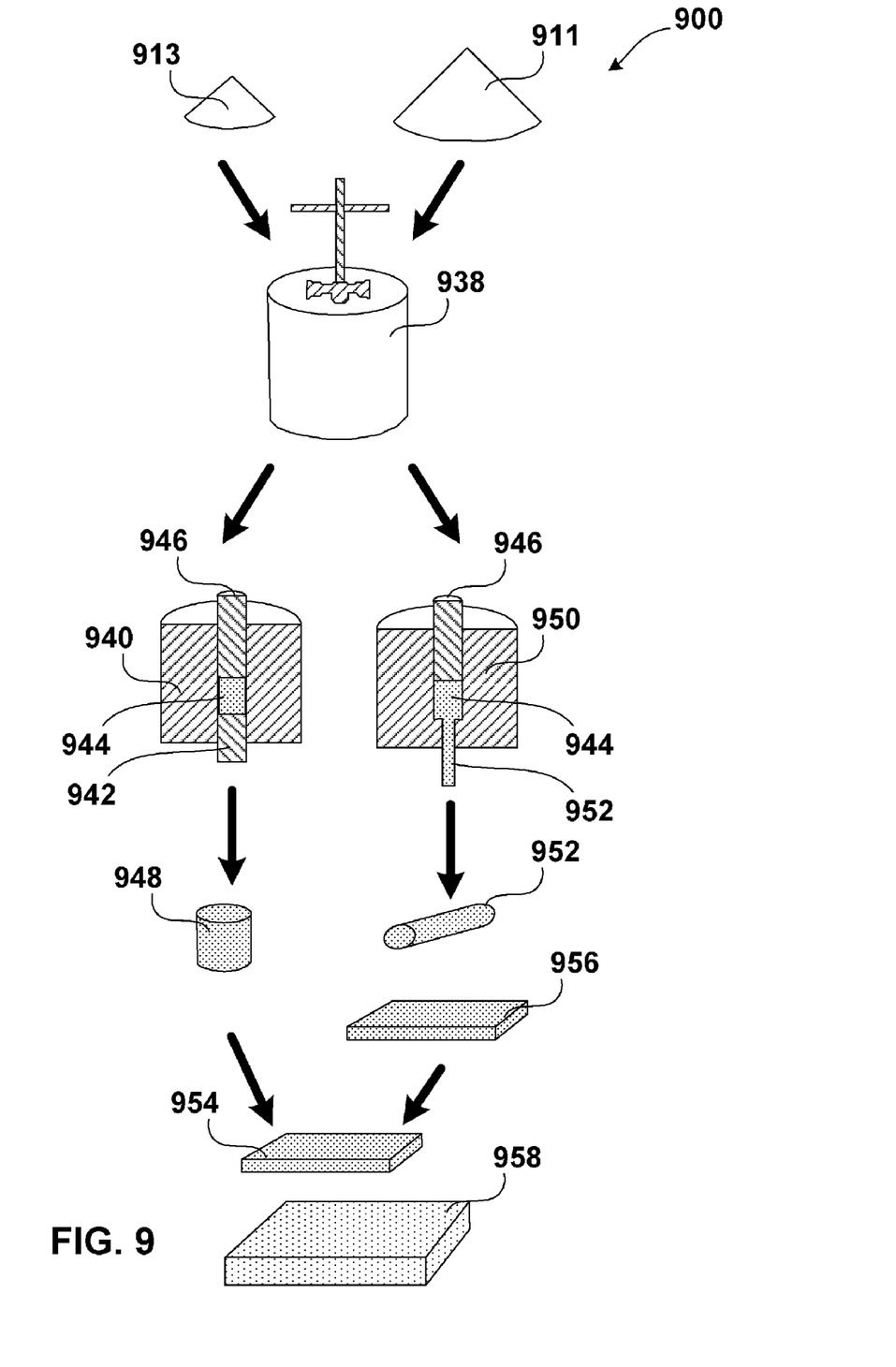
FIG. 9 is a process depiction of forming a porous BMG electrical connection according to an embodiment.

FIG. 9 is a process depiction 900 of forming a porous BMG electrical connection according to an embodiment. Processing begins by first intermingling a foamed BMG precursor 911 with a blowing agent 913. In an embodiment, the foamed BMG precursor 911 is a metal particulate that has an average particle diameter in a range from about 5 nm to about 50 nm. In an embodiment, the foamed BMG precursor 911 is a metal particulate that has an average particle diameter in a range from about 10 nm to about 40 nm. In an embodiment, the foamed BMG precursor 911 is a metal particulate that has an average particle diameter in a range from about 15 nm to about 30 nm. In an embodiment, the foamed BMG precursor 911 is a metal particulate that has an average particle diameter that is about 99% passing 20 nm and about 98% larger than about 5 nm.

In an embodiment, the blowing agent 913 is a metal hydride such as titanium hydride ($TiH_2$). In an embodiment, the blowing agent 913 is a metal hydride such as zirconium hydride ($ZrH_2$). In an embodiment, the blowing agent 913 is a metal hydride such as hafnium hydride ($HfH_2$). In an embodiment, the blowing agent 913 is a refractory metal hydride, represented as $RH_2$. In an embodiment, the blowing agent 913 substantially matches the particle size distribution of the foamed solder precursor. In an embodiment, the foamed BMG precursor 911 includes a metallic surfactant that facilitates the formation of the foamed BMG In FIG. 9, the foamed BMG precursor 911 and the blowing agent 913, or a voiding agent if it is a solid, is placed into a mixing vessel 938, such as is known in the metal-comminution arts. The mixing vessel 938 is then operated by blending the foamed BMG precursor 911 and the blowing agent 913 to achieve a precursor-blowing agent mixture. Hereinafter, "blowing agent" and "voiding agent" will be referred to as "blowing agent," but either is meant unless explicitly referred to.

In an embodiment, the BMG precursor-blowing agent mixture is compressed in an axial-compression die 940. Compression dies are used, for example, in the powder metallurgy consolidation art. An anvil 942 receives a BMG precursor-blowing agent mixture 944 and is pressed into the anvil 942 by a ramrod 946. The result following axial pressing is an axially pressed BMG pellet 948.

In an embodiment, the BMG precursor-blowing agent mixture 944 is compressed in an extrusion die 950. Extrusion is known, for example, in the powder metallurgy extrusion art. The BMG precursor-blowing agent mixture 944 is pressed into the extrusion die 950 by a ramrod 946. The result after extrusion is an extruded BMG pellet 952.

In an embodiment, either the axially pressed BMG pellet 948 or the extruded BMG pellet 952 is a BMG precursor that is further processed such as rolling to achieve rolled sheet stock 954 or 956. In an embodiment, the BMG pellet 948 or 952 or the BMG rolled sheet stock 954 or 956 is stamped into BMG pellets 948 or 952 of a BMG precursor for further processing.

Processing of the substantially cubical or solid cylindrical pieces of the BMG precursor from a pressed or extruded pellet includes tumbling to achieve a more spherical shape or grinding in a mill. In an embodiment, autogenous grinding of the BMG precursor is done in a tumbling mill. In an embodiment, semi-autogenous grinding of the BMG precursor is done in a tumbling mill with the presence of a first amount of grinding media such as ceramic balls. In an embodiment, mill-grinding of the BMG precursor is done in a tumbling mill with a second amount of grinding media that is greater than the first amount of grinding media. In an embodiment, after first grinding the BMG precursor to achieve a spherical shape, surface finishing is carried out in a less extreme tumbling environment.

After forming the BMG precursor into a desired shape, the desired shape is further processed under heating to achieve a BMG 958.

Figure 10:
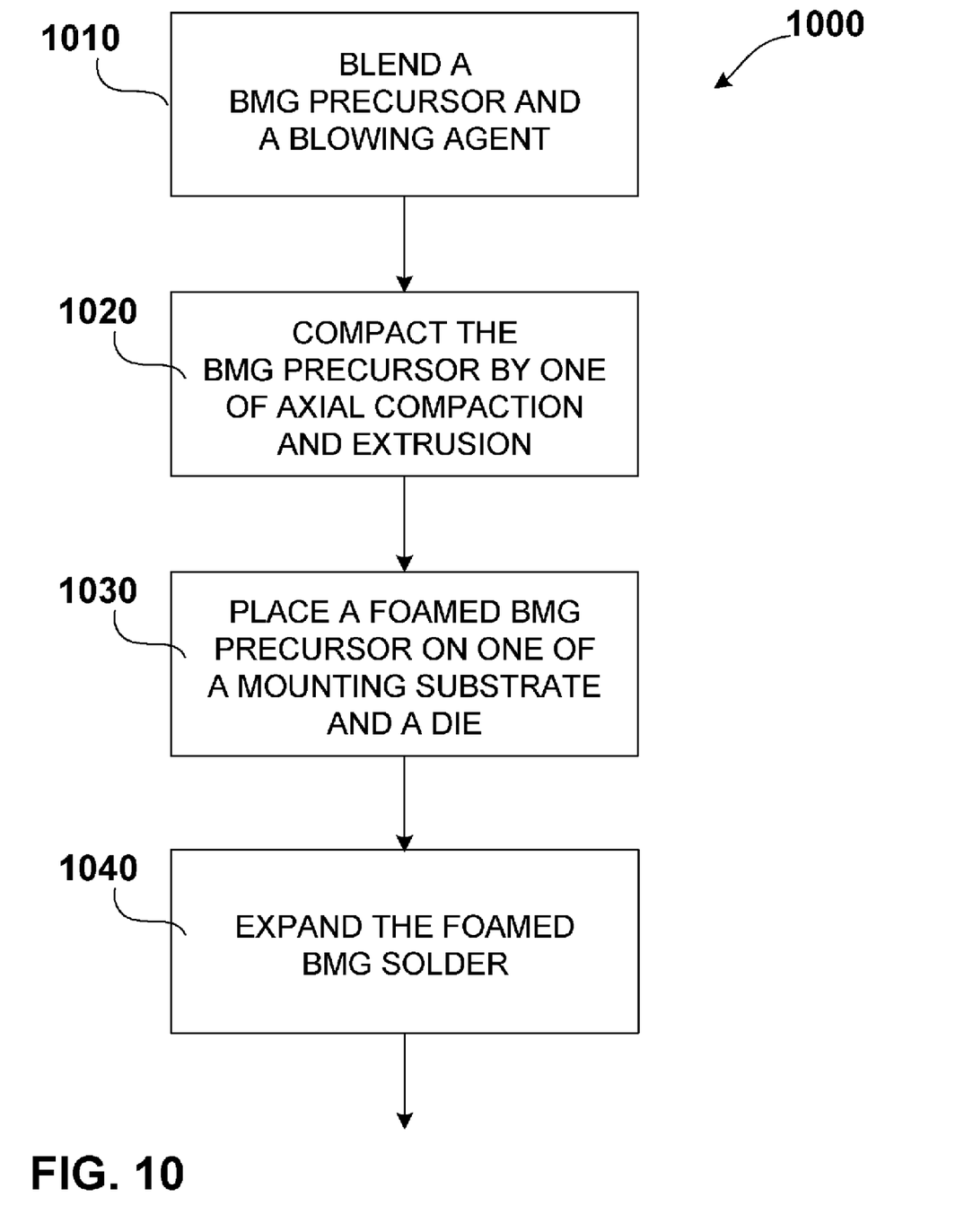
FIG. 10 is a process flow diagram for processing a BMG precursor according to an embodiment.

FIG. 10 is a process flow diagram 1000 for processing a BMG precursor according to an embodiment.

At 1010, the process includes blending a BMG precursor and a blowing agent.

At 1020, the process includes compacting the BMG precursor into a foamed BMG precursor.

At 1030, the process includes placing the foamed BMG precursor upon one of a mounting substrate and a die.

At 1040, the process includes expanding the foamed BMG solder to achieve a BMG.

Figure 11:
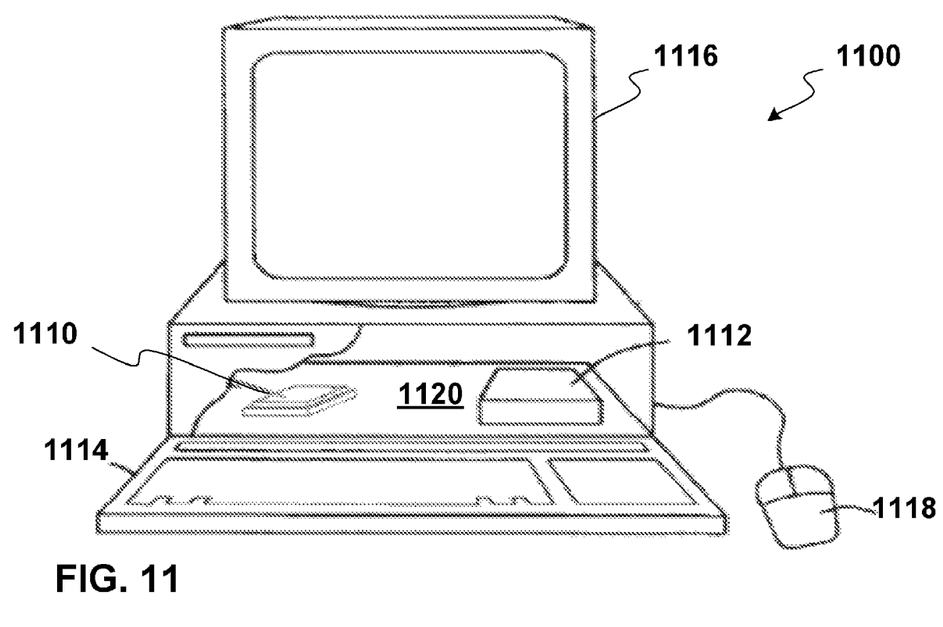
FIG. 11 is a cut-away perspective that depicts a computing system according to an embodiment.

FIG. 11 is a cut-away perspective that depicts a computing system 1100 according to an embodiment. One or more of the foregoing embodiments of the foamed solder bumps, foamed BMG elongate pads, or BMG spheres may be utilized in a computing system, such as computing system 1100 of FIG. 11. Hereinafter any foamed BMG electrical connections, foamed BMG elongate pad electrical connections, or BMG spheres embodiments alone, or in combination with any other embodiment, is referred to as an embodiment(s) configuration.

The computing system 1100 includes at least one processor (not pictured), which is enclosed in a package 1110, a data storage system 1112, at least one input device such as a keyboard 1114, and at least one output device such as a monitor 1116, for example. The computing system 1100 includes a processor that processes data signals, and may include, for example, a microprocessor, available from Intel Corporation. In addition to the keyboard 1114, the computing system 1100 can include another user input device such as a mouse 1118, for example.

For purposes of this disclosure, a computing system 1100 embodying components in accordance with the claimed subject matter may include any system that utilizes a microelectronic device system, which may include, for example, at least one of the BMG bumps, foamed BMG elongate pads, or BMG spheres embodiments that is coupled to data storage such as dynamic random access memory (DRAM), polymer memory, flash memory, and phase-change memory. In this embodiment, the embodiment(s) is coupled to any combination of these functionalities by being coupled to a processor. In an embodiment, however, an embodiment(s) configuration set forth in this disclosure is coupled to any of these functionalities. For an example embodiment, data storage includes an embedded DRAM cache on a die. Additionally in an embodiment, the embodiment(s) configuration that is coupled to the processor (not pictured) is part of the system with an embodiment(s) configuration that is coupled to the data storage 1112 of the DRAM cache. Additionally in an embodiment, an embodiment(s) configuration is coupled to the data storage 1112.

In an embodiment, the computing system 1100 can also include a die that contains a digital signal processor (DSP), a micro controller, an application specific integrated circuit (ASIC), or a microprocessor. In this embodiment, the embodiment(s) configuration is coupled to any combination of these functionalities by being coupled to a processor. For an example embodiment, a DSP (not pictured) is part of a chipset that may include a stand-alone processor and the DSP as separate parts of the chipset on a board 1120. In this embodiment, an embodiment(s) configuration is coupled to the DSP, and a separate embodiment(s) configuration may be present that is coupled to the processor in the package 1110. Additionally in an embodiment, an embodiment(s) configuration is coupled to a DSP that is mounted on the same board 1120 as the package 1110. It can now be appreciated that the embodiment(s) configuration can be combined as set forth with respect to the computing system 1100, in combination with an embodiment(s) configuration as set forth by the various embodiments of the foamed BMG bumps, foamed BMG elongate pads, or BMG solder spheres within this disclosure and their equivalents.

Figure 12:
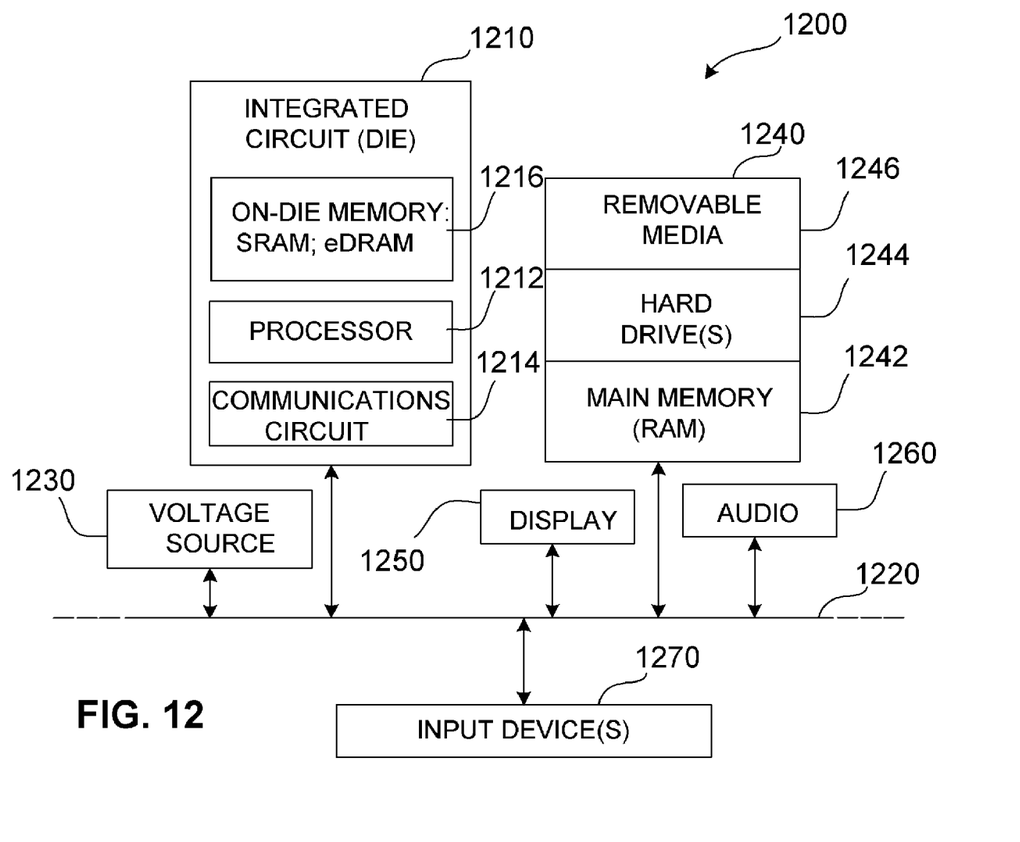
FIG. 12 is a schematic of a computing system according to an embodiment.

FIG. 12 is a schematic of a computing system according to an embodiment. The electronic system 1200, as depicted, can embody the computing system 1100 depicted in FIG. 11, but the electronic system is depicted schematically. The electronic system 1200 incorporates at least one electronic assembly 1210, such as an IC package illustrated in FIGS. 3-6. In an embodiment, the electronic system 1200 is a computer system that includes a system bus 1220 to electrically couple the various components of the electronic system 1200. The system bus 1220 is a single bus or any combination of busses according to various embodiments. The electronic system 1200 includes a voltage source 1230 that provides power to the integrated circuit 1210. In some embodiments, the voltage source 1230 supplies current to the integrated circuit 1210 through the system bus 1220.

The integrated circuit 1210 is electrically coupled to the system bus 1220 and includes any circuit, or combination of circuits, according to an embodiment. In an embodiment, the integrated circuit 1210 includes a processor 1212 that can be of any type. As used herein, the processor 1212 means any type of circuit such as, but not limited to, a microprocessor, a microcontroller, a graphics processor, a digital signal processor, or another processor. Other types of circuits that can be included in the integrated circuit 1210 are a custom circuit or an ASIC, such as a communications circuit 1214 for use in wireless devices such as cellular telephones, pagers, portable computers, two-way radios, and similar electronic systems. In an embodiment, the integrated circuit 1210 includes on-die memory 1216 such as SRAM. In an embodiment, the processor 1210 includes on-die memory 1216 such as embedded DRAM (eDRAM).

In an embodiment, the electronic system 1200 also includes an external memory 1240 that in turn may include one or more memory elements suitable to the particular application, such as a main memory 1242 in the form of RAM, one or more hard drives 1244, and/or one or more drives that handle removable media 1246 such as diskettes, compact disks (CDs), digital video disks (DVDs), flash memory keys, and other removable media known in the art.

In an embodiment, the electronic system 1200 also includes a display device 1250, and an audio output 1260. In an embodiment, the electronic system 1200 includes a controller 1270, such as a keyboard, mouse, trackball, game controller, microphone, voice-recognition device, or any other device that inputs information into the electronic system 1200.

As shown herein, integrated circuit 1210 can be implemented in a number of different embodiments, including an electronic package, an electronic system, a computer system, one or more methods of fabricating an integrated circuit, and one or more methods of fabricating an electronic assembly that includes the integrated circuit and the foamed BMG electrical connection embodiments as set forth herein in the various embodiments and their art-recognized equivalents. The elements, materials, geometries, dimensions, and sequence of operations can all be varied to suit particular packaging requirements.

It can now be appreciated that BMG electrical connection embodiments set forth in this disclosure can be applied to devices and apparatuses other than a traditional computer. For example, a die can be packaged with an embodiment(s) configuration, and placed in a portable device such as a wireless communicator or a hand-held device such as a personal data assistant and the like. Another example is a die that can be packaged with an embodiment(s) configuration and placed in a vehicle such as an automobile, a locomotive, a watercraft, an aircraft, or a spacecraft.

The Abstract is provided to comply with 37 C.F.R. §1.72(b) requiring an abstract that will allow the reader to quickly ascertain the nature and gist of the technical disclosure. It is submitted with the understanding that it will not be used to interpret or limit the scope or meaning of the claims.

In the foregoing Detailed Description, various features are grouped together in a single embodiment for the purpose of streamlining the disclosure. This method of disclosure is not to be interpreted as reflecting an intention that the claimed embodiments of the invention require more features than are expressly recited in each claim. Rather, as the following claims reflect, inventive subject matter lies in less than all features of a single disclosed embodiment. Thus the following claims are hereby incorporated into the Detailed Description, with each claim standing on its own as a separate preferred embodiment.

It will be readily understood to those skilled in the art that various other changes in the details, material, and arrangements of the parts and method stages which have been described and illustrated in order to explain the nature of this invention may be made without departing from the principles and scope of the invention as expressed in the subjoined claims.

What is claimed is:

1. An article comprising:
   bulk metallic glass, wherein the bulk metallic glass is in a macrostructural configuration selected from an electrical bump, a metallization interconnect, a trace, and a bond pad.

2. The article of claim 1, wherein the bulk metallic glass has a microstructural foamed configuration selected from cellular foam and reticulated foam.

3. The article of claim 1, wherein the bulk metallic glass is a zirconium alloy, selected from ZrAlCuO, ZrAlNiCuO, ZrAlNiCuO, ZrTiAlNiCuO, ZrAlNiCu(Cr, Mo), ZrAlNiCu (Ag, Pd, Au, Pt), ZrAlNiCu(Nb, Ta, V), ZrAlNi(Ag, Pd, Au, Pt), ZrAlCCuPd, ZrNi(Fe, Co), ZrNi(Pd, Au, Pt), ZrCuPd, ZrPd, ZrPt, or combinations thereof.

4. The article of claim 1, wherein the bulk metallic glass is a hafnium alloy, selected from HfAlNiCu, HfAlNiCuPd, HfAlNiAg, HfCu(Pd, Pt), or combinations thereof.

5. The article of claim 1, wherein the bulk metallic glass is a titanium alloy, selected from TiZrNi, TiZrNiCu, or a combination thereof.

6. The article of claim 1, wherein the bulk metallic glass is an iron alloy.

7. The article of claim 1, wherein the bulk metallic glass is selected from a zirconium alloy, a hafnium alloy, a titanium alloy, an iron alloy, or combinations thereof.

8. The article of claim 1, wherein the macrostructural configuration is an electrical bump with a bump diameter in a range from about 1 μm to about 300 μm.

9. The article of claim 1, wherein the macrostructural configuration is an electrical bump including:
   a foamed solder core first material; and
   a solder substrate second material upon which the foamed solder core first material is disposed.

10. The article of claim 1, wherein the macrostructural configuration is an electrical bump including:
    a foamed solder core first material; and
    a solder shell second material covering the foamed solder core first material.

11. The article of claim 1, wherein the macrostructural configuration is a metallization interconnect, and wherein the bulk metallic glass has a microstructural foamed configuration selected from cellular foam and reticulated foam.

12. The article of claim 1, wherein the macrostructural configuration is an electrical bump including a first electrical bump and a second electrical bump spaced apart from the first electrical bump.

13. The article of claim 1, wherein the macrostructural configuration includes a first electrical bump and a second electrical bump spaced apart from the first electrical bump, and wherein the first electrical bump and the second electrical bump are adjacent and spaced apart at a pitch of less than or equal to 0.8 millimeter.

14. The article of claim 1, wherein the macrostructural configuration is an electrical bump that is configured upon a mounting substrate at a board side thereof.

15. The article of claim 1, wherein the macrostructural configuration is an electrical bump that is configured upon a mounting substrate at a die side thereof.

16. An article comprising:
    a bond pad in an integrated circuit device, wherein the bond pad has a foamed-metal microstructural configuration, and wherein the bond pad includes a bulk metallic glass.

17. An article comprising:
    a bond pad in an integrated circuit device, wherein the bond pad has a foamed-metal microstructural configuration, wherein the bond pad includes a bulk metallic glass selected from a zirconium alloy, a hafnium alloy, a titanium alloy, an iron alloy, and combinations thereof.

18. The article of claim 16, wherein the foamed-metal microstructural configuration is selected from cellular-foamed and reticulated-foamed.

19. The article of claim 16, wherein the bond pad is configured upon a mounting substrate at a board side thereof.

20. The article of claim 16, wherein the bond pad is configured upon a mounting substrate at a die side thereof.

21. A system comprising:
    a die;
    bulk metallic glass coupled to the die, wherein the bulk metallic glass is in a macrostructural configuration selected from an electrical bump, a metallization interconnect, a trace, and a bond pad; and
    dynamic random-access memory coupled to the die.

22. The computing system of claim 21, wherein the computing system is disposed in one of a computer, a wireless communicator, a hand-held device, an automobile, a locomotive, an aircraft, a watercraft, or a spacecraft.

23. The computing system of claim 21, wherein the microelectronic die is selected from a data storage device, a digital signal processor, a micro controller, an application specific integrated circuit, or a microprocessor.

* * * * *